United States Patent [19]
Bond et al.

[11] Patent Number: 5,111,935
[45] Date of Patent: * May 12, 1992

[54] UNIVERSAL LEADFRAME CARRIER

[75] Inventors: Robert H. Bond; Michael A. Olla, both of Denton; Barry Morrison, Bedford; Linn C. Garrison, Dallas, all of Tex.

[73] Assignee: SGS-Thomson Microelectronics, Inc., Carrollton, Tex.

[*] Notice: The portion of the term of this patent subsequent to Mar. 28, 2006 has been disclaimed.

[21] Appl. No.: 265,231

[22] Filed: Oct. 31, 1988

Related U.S. Application Data

[60] Division of Ser. No. 170,069, Mar. 14, 1988, Pat. No. 4,815,595, which is a continuation of Ser. No. 937,558, Dec. 3, 1986, abandoned.

[51] Int. Cl.$^5$ .............................................. B65D 73/02
[52] U.S. Cl. ..................................................... 206/329
[58] Field of Search ................... 357/75; 206/328, 329, 206/330, 331, 332

[56] References Cited

U.S. PATENT DOCUMENTS

| | | | |
|---|---|---|---|
| Re. 30,604 | 5/1981 | Kowalski | 357/70 |
| 3,385,426 | 5/1968 | May et al. | 206/330 X |
| 3,407,925 | 10/1968 | Ruehlemann | 206/328 |
| 3,469,684 | 9/1969 | Keady et al. | 29/827 |
| 3,550,766 | 12/1970 | Nixen | 206/328 |
| 3,571,920 | 3/1971 | Berg | 206/330 |
| 3,868,759 | 3/1975 | Hartleroad et al. | 29/464 |
| 4,386,463 | 6/1983 | McLaughlin | 29/827 |
| 4,627,533 | 12/1986 | Pollard | 29/25.35 X |
| 4,661,886 | 4/1987 | Nelson et al. | 361/400 X |
| 4,692,790 | 9/1987 | Oyamada | 357/80 X |
| 4,815,595 | 3/1989 | Bond et al. | 206/330 |

FOREIGN PATENT DOCUMENTS

| | | | |
|---|---|---|---|
| 976665 | 10/1975 | Canada | 29/827 |
| 103889 | 3/1984 | European Pat. Off. | |
| 52-18171 | 2/1977 | Japan | 29/827 |
| 8202458 | 7/1982 | PCT Int'l Appl. | 357/75 |
| 1188451 | 4/1970 | United Kingdom | 29/827 |

Primary Examiner—William I. Price
Attorney, Agent, or Firm—Richard K. Robinson; Lisa K. Jorgenson; Dennis T. Griggs

[57] ABSTRACT

A leadframe carrier and insert compatible with a temperature-affectable, expandable and contractable leadframe strip to be bonded with a selected plurality of semiconductor chips, said carrier being automatically separable and removable with regard to said insert during manufacture despite possible clinging which may be induced by the expansion and contraction of said carrier insert.

8 Claims, 1 Drawing Sheet

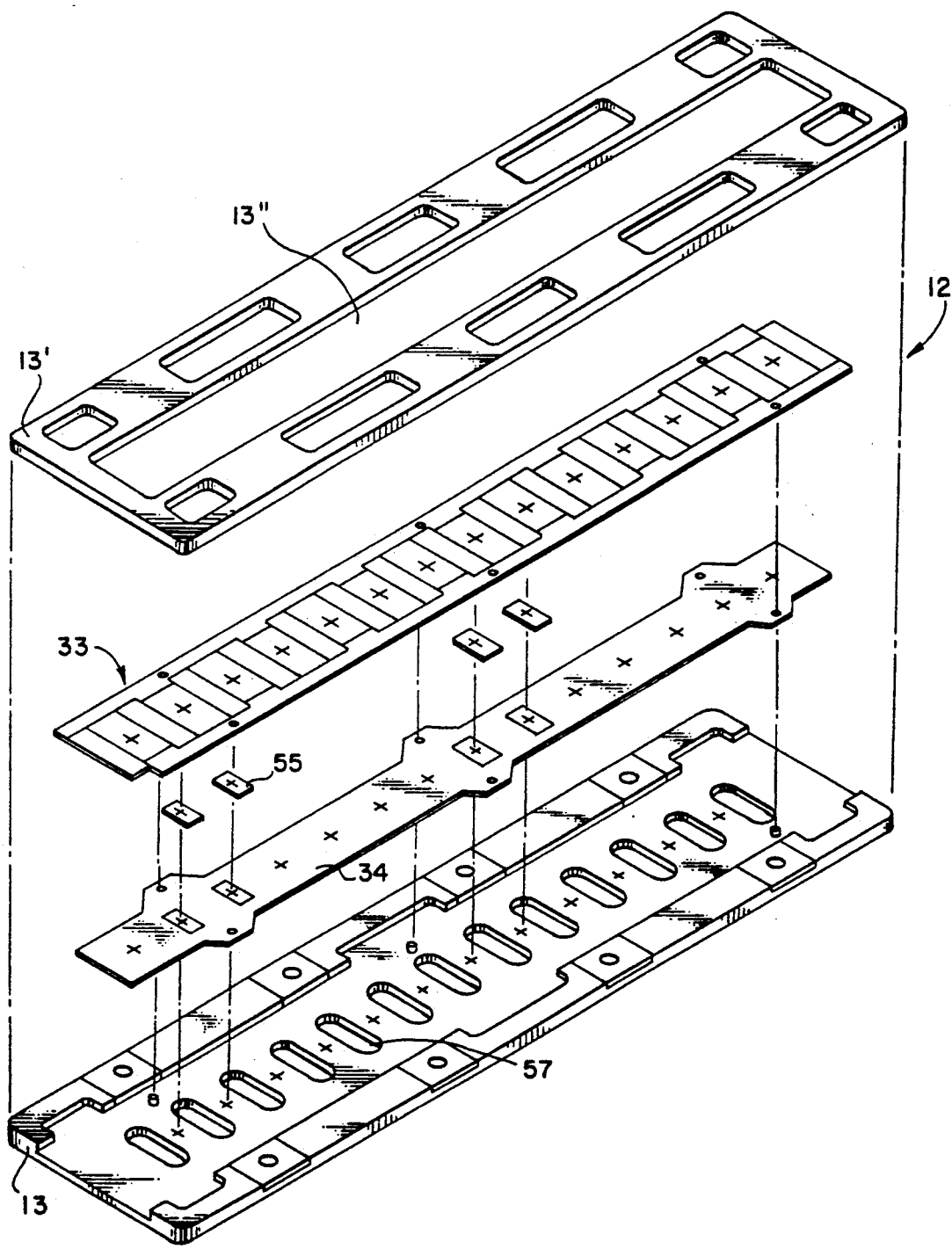

UNIVERSAL LEADFRAME CARRIER

This application is a division, of application Ser. No. 07/170,069 filed, Mar. 3, 1988 now U.S. Pat. No. 4,815,595 which is a continuation of 06/937,558, filed Dec. 3, 1986, - (now abandoned.)

TECHNICAL FIELD

This invention is directed toward the technical field of manufacturing semiconductor chips, and more particularly to their automated manufacture, including the automated bonding of leadframe leads to the chips.

BACKGROUND ART

In the automated manufacture and packaging of semiconductor chips, chips are made in batches instead of individually. Leadframes are typically made from strips or ribbons of flat sheets of conductive material, which is divided into a predetermined selected number of individual leadframes, each of the leadframes defining a plurality of leads sixteen (16), for example, which are bonded to pads on the semiconductor chip.

To handle these strips of leadframes during automated manufacture, it is useful to have a fixture which effectively holds individual strips of the leadframe together with the chips for bonding. One such fixture is called a leadframe carrier. These leadframe carriers can be systemmatically moved from station to station during manufacture on a belt or pressurized air, for example.

At present, the leadframe carrier is typically a custom device used for one particular kind of leadframe, which in turn corresponds in many cases to only a single kind or type or group of types of semiconductor chips. Accordingly, it is considered desirable to develop a leadframe carrier fixture which is conveniently adaptable to accommodate any of many different kinds of chips and leadframes.

DISCLOSURE OF INVENTION

According to the invention addressed herein, the leadframe carrier includes an insert which fits between the upper and lower portions of the main carrier assembly.

The fixture insert is made to defined dimensions of length and width from a flat, rigid sheet of conductive (e.g., metallic) material. The specific material used is selected to accommodate temperature-related expansion and contraction of the leadframe material carried by the insert. According to one version of the invention, both leadframe and insert are made of a selected copper alloy. Formerly, the leadframe carrier and the leadframe itself would expand and contract with temperature by different amounts, creating a poor fit between carrier and leadframe during manufacture.

Further, a feature of the carrier insert is its being coated with a material such as Teflon, a trademark owned by DuPont. This material permits the easy, nonclinging separation of leadframe and carrier, when this is desired during manufacture.

The leadframe carrier itself has upper and lower parts which can be clamped together to hold a strip of leadframe and the insert holding the chips to be bonded to the leads of the leadframe. Clamping can for example be magnetic.

The foregoing and other objects, features and advantages of the present invention will become more apparent from the following description of the best mode for carrying out the invention and the accompanying drawing.

BRIEF DESCRIPTION OF DRAWING

The Figure shows isometrically in exploded view the top and bottom portions of a leadframe carrier and the chip carrying insert according to the invention herein.

BEST MODE FOR CARRYING OUT THE INVENTION

The Figure shows a leadframe carrier 12 including bottom and top or upper and lower, as the case may be, portions 13 and 13'. Further shown are a leadframe 33 and carrier insert 34, which is schematically indicated effectively to suggest its functional parts. Insert 34 fits into the bottom portion 13 of leadframe carrier 12.

Insert 34 holds a plurality of semiconductor chips 55 in a generally linear configuration in recesses fashioned in the top surface thereof.

Semiconductor chips 55 are to be bonded onto the ends of inner leads of the leadframe 33 during manufacturing operation.

According to the invention, if chips 55 of a nonstandard or different than conventional size are to be bonded with leads from the same or a modified kind of leadframe; or if a different kind or size of leadframe is selected for bonding; then a different insert 34 according to the invention can be used with the same universal carrier.

The lower carrier portion 13 defines holes 57 in its mass which reduce its overall weight, thereby making it lighter and easier to propel during automated operations and to reduce the thermal load as seen by the reflow medium.

Further, upper portion 13' of carrier 12 defines similar weight saving apertures of its own and further define a large central aperture 13", which permits the application of a heating vapor during manufacture, to effect the solder bonding of leads from the leadframe to pads on a corresponding semiconductor chip 55. Pins in lower portion 13 help to align and secure the leadframe during clamping together (whether magnetic or otherwise).

As shown in the Drawing, the insert defines depressions of defined size for holding semiconductor chips 55 of corresponding size insertably therein with their bonding pads upwardly disposed to meet the inner ends of leads from the leadframe. If larger (or smaller) chips are to be used instead, a different insert can be used, without requiring a new bottom portion 13 to be provided or otherwise fabricated.

As already suggested above, a single strip or ribbon of leadframe includes many individual leadframes. Each leadframe in effect contains the leads for a single chip. These leads are electrically shorted together during most of the manufacturing process, but are held together contiguously by a central perimeter from the same sheet material out of which the entire leadframe ribbon is fashioned or fabricated. The leads in effect traverse this perimeter, and those portions of the perimeter which are not part of a lead are ultimately cut away later in production.

Further, the individual chips 55 bonded to respective individual leadframes of the ribbon must of course be separated at the end of manufacturing operation.

The leads are in fact separated from one another after being encapsulated in plastic, for example, during a late state of manufacture called trim and form. This breaks up the perimeter of leadframe material which initially interconnects and holds together the leads during bonding, handling and plastic molding.

It is the end of each inner lead of the leadframe which is bonded to a corresponding contact pad on the respective chip. The outer portion of each lead in turn extends out of the package, which may be made of molded or injected plastic or ceramic material as the case may be. The outer portion of each lead is further typically bent and offset downward as for insertion into a plug or socket as the case may be.

Each semiconductor chip is thus finally packaged with an array of downwardly disposed pins for insertion into or connector.

So-called leadless chip carriers are further also well known in the industry. In the case of these, no pins extend downward to meet with a mating plug or connector. Instead, the so-called leadless contacts are respectively soldered directly onto predetermined locations on a printed circuit board or chip carrier. The concepts of this invention are, however, applicable to either kind of package, leaded or leadless.

Individuals skilled in the art are likely to conceive of other versions of the invention which are nonetheless a part thereof. Accordingly, attention is directed toward the claims which follow, as these effectively and legitimately define the bounds of the invention with particularity.

What is claimed:

1. A chip carrier insert for supporting semiconductor chips in alignment with groups of inner leads of a lead frame during a manufacturing operation in which lead frame inner lead end portions are to be bonded to bonding pads on the semiconductor chips with the chip carrier insert and lead frame being sandwiched between first and second lead frame carriers, said chip carrier insert being a strip of conductive metal fabricated to predetermined dimensions of length and width to fit between the first and second lead frame carriers, said strip of conductive metal having surface portions adapted for retaining a plurality of semiconductor chips in bonding alignment with the end portions of a plurality of lead frame inner lead groups, respectively;

a selected one of said lead frame carriers having first and second shoulder portions spaced apart across an elongated channel, wherein said strip of conductive metal has length and width dimensions adapted to fit within the elongated channel between the first and second shoulders; and, a plurality of pins attached to said selected lead frame carrier and projecting into the elongated channel, said lead frame and strip of conductive metal being intersected by a plurality of bores, wherein said pins project through said chip carrier insert and through said lead frame for aligning the chip bonding pads with the lead frame inner ends and securing the selected lead frame carrier, chip carrier insert and lead frame together.

2. A chip carrier insert as defined in claim 1, wherein said strip of conductive metal is characterized by a coefficient of thermal expansion which is matched with the coefficient of thermal expansion of the lead frame.

3. A chip carrier insert as defined in claim 1, wherein said surface portions for retaining a plurality of semiconductor chips comprise a plurality of recesses having dimensions corresponding with the dimensions of the semiconductor chips for receiving each chip and retaining it with its bonding pads disposed to meet the inner ends of leads from the lead frame.

4. A chip carrier insert for supporting semiconductor chips in alignment with groups of inner leads of a lead frame during a manufacturing operation in which lead frame inner lead end portions are to be bonded to bonding pads on the semiconductor chips with the chip carrier insert and lead frame being sandwiched between the first and second lead frame carriers, said chip carrier insert being a strip of conductive metal fabricated to predetermined dimensions of length and width to fit between the first and second lead frame carriers, said strip of conductive metal having surface portions adapted for retaining a plurality of semiconductor chips in bonding alignment with the end portions of a plurality of lead frame inner lead groups, respectively; and, a selected one of the lead frame carriers having first and second elongated shoulders disposed on opposite sides of an elongated channel, said chip carrier insert having length and width dimensions adapted for placement between said shoulders within the elongated channel, and with the lead frame being disposed between the chip carrier insert and the other lead frame carrier, wherein the other lead frame carrier is intersected by an elongated central aperture which exposes the end portions of groups of inner leads of said lead frame to contact by a heating vapor during manufacture, to permit the solder bonding of leads from the lead frame to bonding pads on semiconductor chips mounted on said chip carrier insert.

5. A universal lead frame carrier assembly including first and second lead frame carriers defining in combination an inner cavity for receiving a chip carrier insert and a lead frame having a plurality of groups on inner leads, said chip carrier insert having surface portions adapted for retaining a plurality of semiconductor chips in bonding alignment with the inner lead end portions of the plurality of lead frame inner lead groups, said first and second lead frame carriers, said chip carrier insert and said lead frame being fabricated to predetermined dimensions of length, width and depth to permit the chip carrier insert and lead frame to be assembled in stacked relation within the inner cavity;

a selected one of the lead frame carriers having first and second elongated shoulders disposed on opposite sides of an elongated channel, said chip carrier insert having length, width and depth dimensions adapted for placement between said shoulders within the elongated channel, and with the lead frame being disposed between the chip carrier insert and the other lead frame carrier; and, the other lead frame carrier being intersected by an elongated central aperture which exposes the end portions of groups of inner leads of said lead frame to contact by a heating vapor during manufacture, to permit the solder bonding of leads from the lead frame to bonding pads on semiconductor chips mounted on said chip carrier insert.

6. A universal lead frame carrier assembly as defined in claim 5, wherein said chip carrier insert comprises a strip of conductive metal having a coefficient of thermal expansion which is matched with the coefficient of thermal expansion of the lead frame.

7. A universal lead frame carrier assembly as defined in claim 5, wherein said chip carrier insert comprises a strip of conductive metal which is intersected by a plurality of recesses having dimensions corresponding with the dimensions of the semiconductor chips for receiving each chip and retaining it with its bonding pads being positioned to meet the inner ends of leads from the lead frame.

8. A universal lead frame carrier assembly including first and second lead frame carriers defining in combination an inner cavity for receiving a chip carrier insert and a lead frame having a plurality of groups of inner leads, said chip carrier insert having surface portions adapted for retaining a plurality of semiconductor chips in bonding alignment with the inner lead end portions of the plurality of lead frame inner lead groups, said first and second lead frame carriers, said chip carrier insert and said lead frame being fabricated to predetermined dimensions of length, width and depth to permit the chip carrier insert and lead frame to be assembled in stacked relation within the inner cavity; and, a plurality of pins attached to a selected one of said lead frame carriers, said plurality of pins projecting into said cavity, and said lead frame and chip carrier insert being intersected by a plurality of bores, wherein said pins project through said chip carrier insert and through said lead frame for aligning the chip bonding pads with the lead frame inner ends and securing the selected lead frame carrier, chip carrier insert and lead frame together.

* * * * *